(12) United States Patent
Su et al.

(10) Patent No.: US 9,093,235 B2
(45) Date of Patent: Jul. 28, 2015

(54) TOUCH PAD MODULE AND ELECTRONIC DEVICE

(71) Applicant: Acer Incorporated, New Taipei (TW)

(72) Inventors: Iou-Ren Su, New Taipei (TW); Chung-Jen Ho, New Taipei (TW)

(73) Assignee: Acer Incorporated, New Taipei (TW)

( * ) Notice: Subject to any disclaimer, the term of this patent is extended or adjusted under 35 U.S.C. 154(b) by 284 days.

(21) Appl. No.: 13/859,728

(22) Filed: Apr. 9, 2013

(65) Prior Publication Data

US 2014/0204507 A1 Jul. 24, 2014

(30) Foreign Application Priority Data

Jan. 22, 2013 (TW) .............................. 102201409 U

(51) Int. Cl.
*H05K 5/00* (2006.01)
*H01H 13/14* (2006.01)
*H01H 9/02* (2006.01)

(52) U.S. Cl.
CPC ............. *H01H 13/14* (2013.01); *H01H 9/0207* (2013.01); *H05K 5/00* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,339,213 A * | 8/1994 | O'Callaghan | ............ | 361/679.55 |
| 5,793,355 A * | 8/1998 | Youens | .......................... | 345/157 |
| 6,177,924 B1 * | 1/2001 | Bae | ............................... | 345/157 |
| 6,657,855 B2 * | 12/2003 | Misawa et al. | ............ | 361/679.09 |
| 7,085,130 B2 * | 8/2006 | Lin et al. | .................... | 361/679.1 |
| 7,119,291 B2 * | 10/2006 | Sun | ................. | 200/5 A |
| 7,294,805 B2 * | 11/2007 | Luo et al. | ....................... | 200/500 |
| 7,486,278 B2 * | 2/2009 | Sun | ................................. | 345/173 |
| 7,767,923 B2 * | 8/2010 | Lin et al. | ...................... | 200/345 |
| 7,855,897 B2 * | 12/2010 | Lin et al. | ....................... | 361/799 |
| 7,920,125 B2 * | 4/2011 | Imamura | ....................... | 345/157 |
| 7,948,741 B2 * | 5/2011 | Fan | ............................ | 361/679.1 |
| 8,139,347 B2 * | 3/2012 | Chiang et al. | ............ | 361/679.18 |
| 8,174,846 B2 * | 5/2012 | Hamada et al. | ............... | 361/810 |
| 8,213,166 B2 * | 7/2012 | Mihara et al. | .............. | 361/679.1 |
| 8,373,977 B2 * | 2/2013 | Shao et al. | .................. | 361/679.1 |
| 8,537,541 B2 * | 9/2013 | Zhang | ...................... | 361/679.55 |
| 8,564,938 B2 * | 10/2013 | Horii et al. | ................ | 361/679.01 |
| 8,692,146 B2 * | 4/2014 | Mihara et al. | ................. | 200/314 |
| 8,693,179 B2 * | 4/2014 | Wei | ........................... | 361/679.18 |
| 8,803,806 B2 * | 8/2014 | Mundt et al. | ................... | 345/168 |
| 8,803,852 B2 * | 8/2014 | Tsai et al. | ..................... | 345/184 |
| 8,811,024 B2 * | 8/2014 | Wei | ............................... | 361/752 |
| 8,866,033 B2 * | 10/2014 | Xue | ............................... | 200/343 |
| 8,963,841 B2 * | 2/2015 | Brooks et al. | ................. | 345/170 |
| 8,964,378 B2 * | 2/2015 | Kao et al. | .................. | 361/679.55 |
| 2007/0144885 A1 * | 6/2007 | Nakatani et al. | .............. | 200/520 |
| 2011/0254786 A1 * | 10/2011 | Wen et al. | ..................... | 345/173 |
| 2011/0254787 A1 * | 10/2011 | Cheng et al. | .................. | 345/173 |
| 2011/0254788 A1 * | 10/2011 | Wang et al. | .................... | 345/173 |

* cited by examiner

*Primary Examiner* — Lisa Lea Edmonds
(74) *Attorney, Agent, or Firm* — Jianq Chyun IP Office

(57) ABSTRACT

A touch pad module suitable for assembling in a casing of an electronic device is provided. The touch pad module includes a switch, a triggering element, a fixing element and an elastic element. The switch is disposed in the casing. The triggering element is disposed in the casing and corresponds to the switch. The fixing element fixes the triggering element to the casing. The elastic element is leaned between the casing and the triggering element, and the elastic element permanently drives the triggering element lean against the fixing element. The touch pad module is subjected to an external force to make the triggering element and switch to lean against each other, and compress the elastic element. An electronic device including a casing and a touch pad module assembled in the casing is also provided.

10 Claims, 3 Drawing Sheets

TOUCH PAD MODULE AND ELECTRONIC DEVICE

CROSS-REFERENCE TO RELATED APPLICATION

This application claims the priority benefit of Taiwan application serial no. 102201409, filed on Jan. 22, 2013. The entirety of the above-mentioned patent application is hereby incorporated by reference herein and made a part of this specification.

BACKGROUND

1. Technical Field

The invention relates to a touch pad module and an electronic device. Particularly, the invention relates to a touch pad module and an electronic device using the touch pad module.

2. Related Art

In recent years, along with quick development of technology industry, electronic devices such as notebook computers (NB), tablet PCs and smart phones are widely used in daily life. Types and functions of the electronic devices are increasingly diversified, and the electronic devices are more popular due to convenience and practicality thereof and can be used for different purposes.

The electronic device, for example, a notebook computer is generally configured with a keyboard module and a touch pad module to serve as an input interface of the electronic device. A touch pad of the touch pad module generally corresponds to a switch, and a user can trigger the switch in internal of the electronic device by touching the touch pad located at external of the electronic device. However, during the process of mass production and assembly, the various elements of the touch pad module generally have dimension tolerances and assembly tolerances. Therefore, after the touch pad module is assembled to a casing, the relevant elements of the touch pad module are probably interfered with the switch to cause key stuck.

SUMMARY

The invention is directed to a touch pad module, which has a better assembly tolerance to avoid interference caused by assembly or dimension tolerance.

The invention is directed to an electronic device, which has a better assembly tolerance to avoid interference caused by assembly or dimension tolerance.

The invention provides a touch pad module adapted to be assembled in a casing of an electronic device. The touch pad module includes a switch, a trigger element, a fixing element and an elastic element. The switch is disposed in the casing. The trigger element is disposed in the casing and corresponds to the switch. The fixing element fixes the trigger element to the casing. The elastic element is leaned between the casing and the trigger element, and the elastic element permanently drives the trigger element to lean against the fixing element. The touch pad module is subjected to an external force to make the trigger element and the switch to lean against each other, and compress the elastic element.

The invention provides an electronic device including a casing and a touch pad module. The touch pad module is disposed in the casing. The touch pad module includes a switch, a trigger element, a fixing element and an elastic element. The switch is disposed in the casing. The trigger element is disposed in the casing and corresponds to the switch. The fixing element fixes the trigger element to the casing. The elastic element is leaned between the casing and the trigger element, and the elastic element permanently drives the trigger element to lean against the fixing element. The touch pad module is subjected to an external force to make the trigger element and the switch to lean against each other, and compress the elastic element.

According to the above descriptions, in the touch pad module and the electronic device of the invention, the fixing element is used to fix the trigger element corresponding to the switch to the casing, where the elastic element leaning between the casing and the trigger element permanently drives the trigger element to lean against the fixing element, and the touch pad module is subjected to an external force to make the trigger element and the switch to lean against each other, and compress the elastic element. In this way, in the trigger pad module and the electronic device, a depth that the fixing element fixes the trigger element to the casing can be adjusted to change a distance between the trigger element and the switch, such that the touch pad module and the electronic device have better assembly tolerance to avoid interference caused by the assembly or dimension tolerance.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
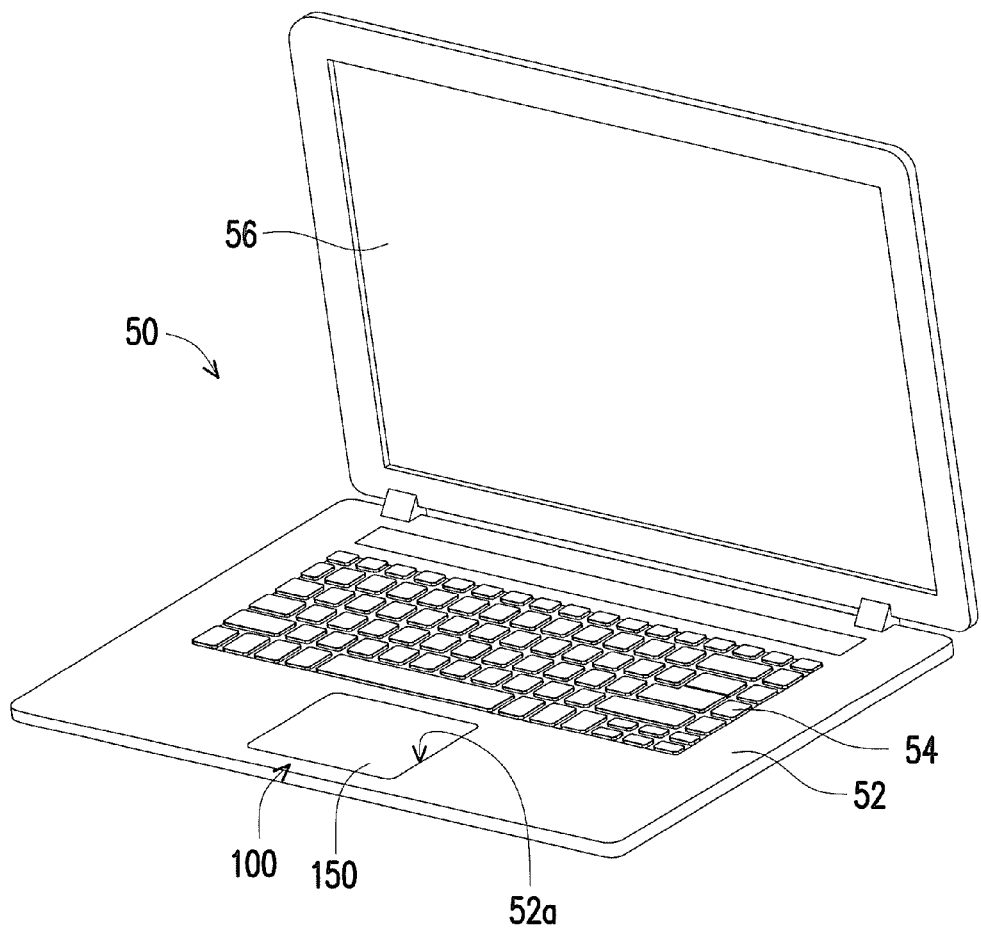
FIG. 1 is a schematic diagram of an electronic device according to an embodiment of the invention.
Figure 2:
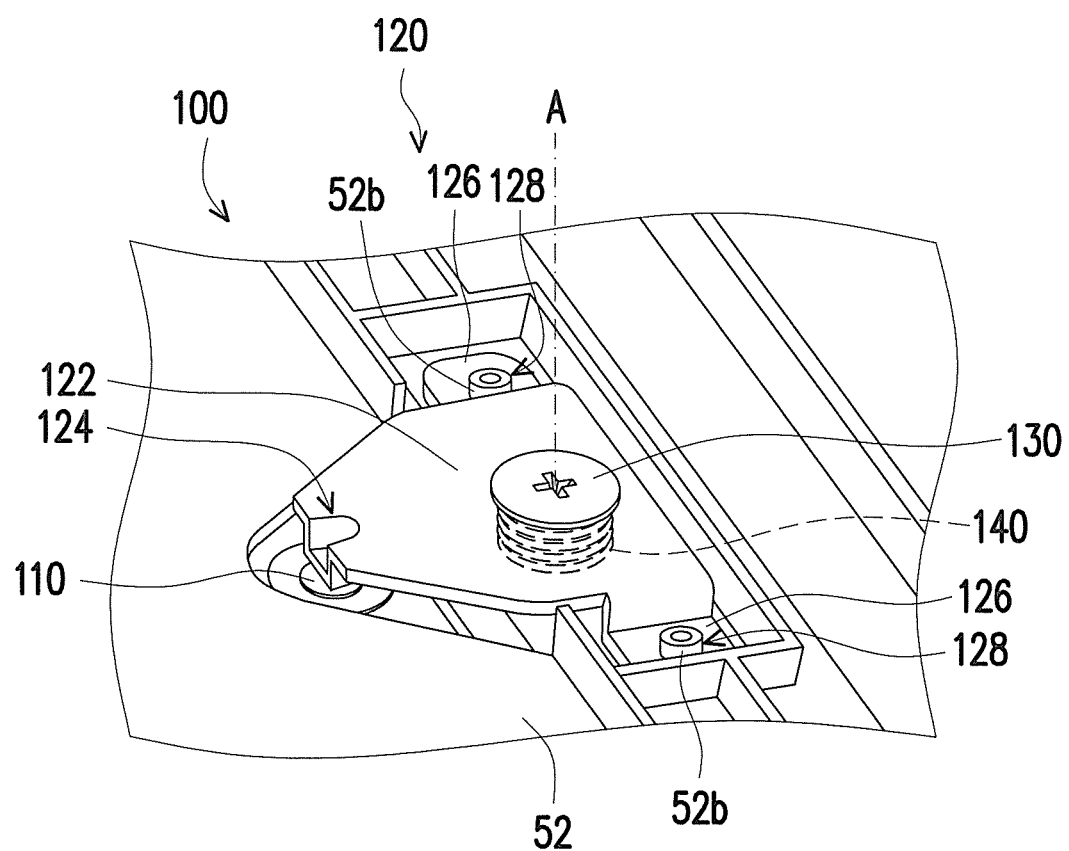
FIG. 2 is a partial enlarged view of a touch pad module of FIG. 1.

FIG. 1 is a schematic diagram of an electronic device according to an embodiment of the invention. FIG. 2 is a partial enlarged view of a touch pad module of FIG. 1. Referring to FIG. 1 and FIG. 2, in the present embodiment, the electronic device 50 includes a casing 52 and a touch pad module 100. The touch pad module 100 is disposed in the casing 52 and corresponds to an opening 52a of the casing 52, where a touch surface thereof is exposed outside the casing 52 by the opening 52a to facilitate a user operating the touch pad module 100. The electronic device 50 is, for example, a notebook computer, which has a keyboard 54 and a display 56, though the type and components of the electronic device 50 are not limited by the invention, and any electronic device using the touch pad module 100 as the input interface is applicable to the present embodiment.

Referring to FIG. 2, in the present embodiment, the touch pad module 100 is disposed in the casing 52 of the electronic device 50. The touch pad module 100 includes a switch 110, a trigger element 120, a fixing element 130 and an elastic element 140. The switch 110 is disposed in the casing 52. The trigger element 120 is disposed in the casing 52 and corresponds to the switch 110. The fixing element 130 fixes the trigger element 120 to the casing 52. The elastic element 140 is leaned between the casing 52 and the trigger element 120, and the elastic element 140 is, for example, a compression/tension spring, which permanently drives the trigger element 120 to lean against the fixing element 130. In other words, the elastic element 140 is considered to be in a compressed state, and the elastic element 140 and the fixing element 130 commonly clamp and fix the trigger element 120.

In detail, in the present embodiment, the trigger element 120 has a fixing portion 122 and a contact portion 124. The fixing element 130 fixes the fixing portion 122 to the casing 52, and the contact portion 124 presents a suspended state relative to the fixing portion 122 for corresponding to the switch 110, such that the trigger element 120 contacts the switch 110 through the contact portion 124. A material of the trigger element 120 is one of plastic and metal, though the invention is not limited thereto. Moreover, the trigger element 120 has elasticity, which is, for example, made of a flexible material, such that the contact portion 124 presenting the suspended state relative to the fixing portion 122 is adapted to move relative to the fixing portion 122 to contact the switch 110 when the fixing portion 122 is fixed to the casing 52. The touch pad module 100 is subjected to an external force exerted from outside the casing 52 to make the trigger element 120 and the switch 110 to lean against each other and compress the elastic element 140. Therefore, in the present embodiment, the touch pad module 100 further includes a touch pad 1501 (shown in FIG. 1) disposed on the trigger element 120 and exposed by the opening 52a. The touch pad 150 is disposed on the trigger element 120 and is exposed outside the casing 52 by the opening 52a. The user can exert the external force to the trigger element 120 by touching the touch pad 150, such that the trigger element 120 and the switch 110 are leaned against each other to trigger the switch 110.

Figure 3:
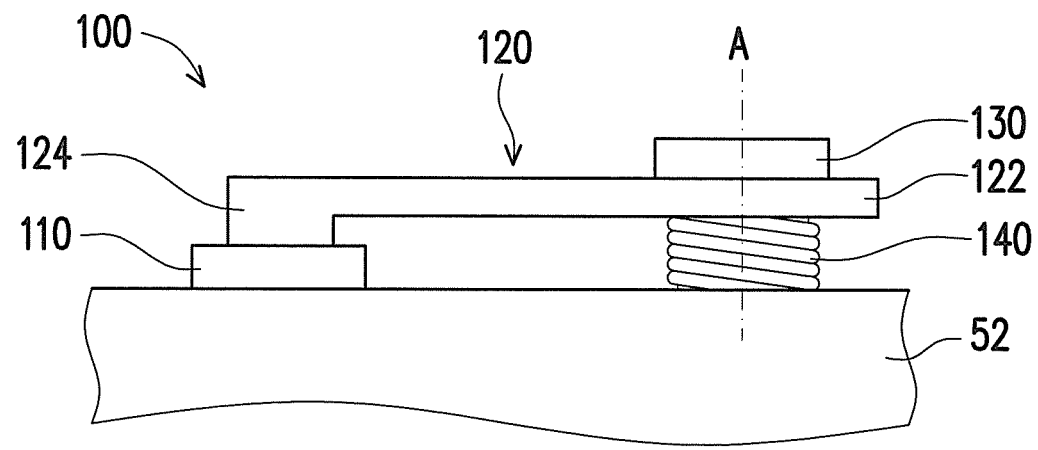
FIG. 3 is a side view of the touch pad module of FIG. 2.
Figure 4:
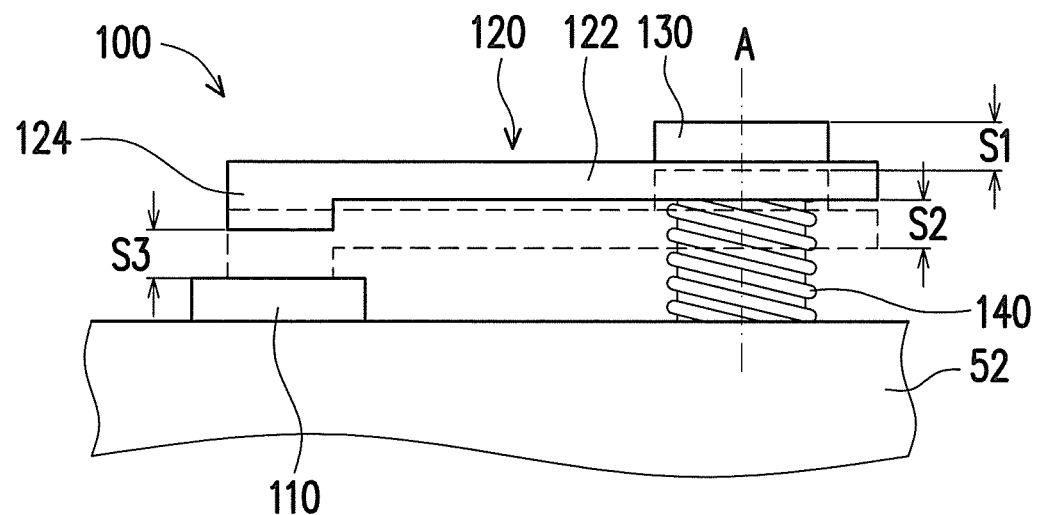
FIG. 4 is a side view of the touch pad module of FIG. 3 in another state.

FIG. 3 is a side view of the touch pad module of FIG. 2, and FIG. 4 is a side view of the touch pad module of FIG. 3 in another state. Referring to FIG. 2 to FIG. 4, in the present embodiment, when the touch pad module 100 is assembled to the casing 52, the fixing element 130 fixes the trigger element 120 to the casing 52 along an axis A, and the elastic element 140 is leaned between the casing 52 and the trigger element 120, where the fixing element 130 is, for example, a screw, which is generally screwed completely into the casing 52 until the screw cannot be rotated, so as to ensure the fixing element 130 fixing the trigger element 120 to the casing 52. Now, in a normal design, the contact portion 124 of the trigger element 120 is separated from the switch 110 by a certain distance, such that when the touch pad module 100 is subjected to the external force, the trigger element 120 can move relative to the switch 110 by a stroke, and the trigger element 120 and the switch 110 are leaned against each other to trigger the switch 110.

However, during the process of mass production and assembly, the various elements of the touch pad module 100 generally have dimension tolerances and assembly tolerances. Therefore, after the fixing element 130 fixes the trigger element 120 to the casing 52, the trigger element 120 is probably interfered with the switch 110, as that shown in FIG. 3. Now, the trigger element 120 is interfered with the switch 110 and cannot move relative to the switch 110, i.e. the trigger element 120 and the switch 110 have an empty stroke there between. In other words, the trigger element 120 and the switch 110 are leaned against each other before the touch pad module 100 is subjected to the external force, such that the touch pad module 100 cannot execute an action of clicking the switch 110.

Therefore, when the fixing element 130 fixes the trigger element 120 to the casing 52, and the trigger element 120 is interfered with the switch 110, the fixing element 130 is moved relative to the casing 52 by a first stroke S1, the elastic element 140 is deformed by a second stroke S2 along with the movement of the fixing element 130, such that the trigger element 120 is departed from the switch 110 by a third stroke S3, where the first stroke S1, the second stroke S2 and the third stroke S3 are equivalent, and directions of the first stroke S1, the second stroke S2 and the third stroke S3 are parallel to the axis A.

In detail, since the elastic element 140 is in a compression state, when the fixing element 130 moves relative to the casing 52 along the axis A by the first stroke S1 and exits the casing 52 slightly, the elastic element 140 is deformed by the second stroke S2 along with the movement of the fixing element 130 along the axis A, and the first stroke S1 is equal to the second stroke S2, where the second stroke S2 of the elastic element 140 deformed along with the movement of the fixing element 130 is smaller than 0.3 mm, though the invention is not limited thereto. Moreover, since the elastic element 140 permanently drives the trigger element 120 to lean against the fixing element 130, when the fixing element 130 moves relative to the casing 52 along the axis A by the first stroke S1, and the elastic element 140 is deformed by the second stroke S2 along with the movement of the fixing element 130 along the axis A, the trigger element 120 is leaned against the fixing element 130 through the elastic element 140, and moves synchronously with the fixing element 130 by the third stroke S3 along the axis A to depart from the switch 110. In this way, the third stroke S3 is equal to the first stroke S1, and the first stroke S1, the second stroke S2 and the third stroke S3 are equivalent.

Moreover, referring to FIG. 2, in the present embodiment, the trigger element 120 includes two extension portions 126, and the extension portions 126 are located at two opposite sides of the fixing portion 122 and respectively have a positioning hole 128. Two positioning posts 52b of the casing 52 penetrate through the two positioning holes 128, where the positioning posts 52b, for example, extend along the axis A to guide the trigger element 120 to depart from the switch 110 by the third stroke S3 along the axis A. In this way, in the touch pad module 100 and the electronic device 50, a depth that the fixing element 130 fixes the trigger element 120 to the casing 52 and a deformation amount of the elastic element 140 can be adjusted to change a distance between the trigger element 120 and the switch 110, such that the touch pad module 100 and the electronic device 50 have better assembly tolerance to avoid interference caused by the assembly or dimension tolerance.

In summary, in the touch pad module and the electronic device of the invention, the fixing element is used to fix the trigger element corresponding to the switch to the casing, where the elastic element leaning between the casing and the trigger element permanently drives the trigger element to lean against the fixing element, and the touch pad module can be subjected to an external force to make the trigger element and the switch to lean against each other, and compress the elastic element. When the trigger element is interfered with the switch, the fixing element is moved by the first stroke and the elastic element is deformed by the second stroke, such that the trigger element is departed from the switch by the third stroke, where the first stroke, the second stroke and the third stroke are equivalent. In this way, in the trigger pad module and the electronic device, a depth that the fixing element fixes the trigger element to the casing can be adjusted to change a distance between the trigger element and the switch, such that the touch pad module and the electronic device have better assembly tolerance to avoid interference caused by the assembly or dimension tolerance.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A touch pad module, adapted to be assembled in a casing of an electronic device, the touch pad module comprising:
    a switch, disposed in the casing;
    a trigger element, disposed in the casing and corresponding to the switch;
    a fixing element, fixing the trigger element to the casing; and
    an elastic element, leaned between the casing and the trigger element, wherein the elastic element permanently drives the trigger element to lean against the fixing element, and the touch pad module is subjected to an external force to make the trigger element and the switch to lean against each other, and compress the elastic element.

2. The touch pad module as claimed in claim 1, wherein when the fixing element fixes the trigger element to the casing and the trigger element is interfered with the switch, the fixing element is moved relative to the casing by a first stroke, and the elastic element is deformed by a second stroke along with movement of the fixing element, such that the trigger element is departed from the switch by a third stroke, wherein the first stroke, the second stroke and the third stroke are equivalent.

3. The touch pad module as claimed in claim 1, wherein the trigger element has a fixing portion and a contact portion, the fixing element fixes the fixing portion to the casing, and the contact portion presents a suspended state relative to the fixing portion for corresponding to the switch.

4. The touch pad module as claimed in claim 3, wherein the trigger element comprises two extension portions located at two sides of the fixing portion and respectively having a positioning hole, and two positioning posts of the casing penetrate through the two positioning holes.

5. The touch pad module as claimed in claim 1, wherein the trigger element is made of one of plastic and metal.

6. An electronic device, comprising:
    a casing; and
    a touch pad module, disposed in the casing, and comprising:
        a switch, disposed in the casing;
        a trigger element, disposed in the casing and corresponding to the switch;
        a fixing element, fixing the trigger element to the casing; and
        an elastic element, leaned between the casing and the trigger element, wherein the elastic element permanently drives the trigger element to lean against the fixing element, and the touch pad module is subjected to an external force to make the trigger element and the switch to lean against each other, and compress the elastic element.

7. The electronic device as claimed in claim 6, wherein when the fixing element fixes the trigger element to the casing and the trigger element is interfered with the switch, the fixing element is moved relative to the casing by a first stroke, and the elastic element is deformed by a second stroke along with movement of the fixing element, such that the trigger element is departed from the switch by a third stroke, wherein the first stroke, the second stroke and the third stroke are equivalent.

8. The electronic device as claimed in claim 6, wherein the trigger element has a fixing portion and a contact portion, the fixing element fixes the fixing portion to the casing, and the contact portion presents a suspended state relative to the fixing portion for corresponding to the switch.

9. The t electronic device as claimed in claim 8, wherein the trigger element comprises two extension portions located at two sides of the fixing portion and respectively having a positioning hole, and two positioning posts of the casing penetrate through the two positioning holes.

10. The electronic device as claimed in claim 6, wherein the trigger element is made of one of plastic and metal.

* * * * *